Sept. 10, 1935. B. KJELLGREN Re. 19,698

METHOD OF PRODUCING CRYSTALS

Original Filed April 27, 1929

INVENTOR
BENGT KJELLGREN
BY
Evans & McCoy
ATTORNEYS

Reissued Sept. 10, 1935 Re. 19,698

UNITED STATES PATENT OFFICE 19,698

METHOD OF PRODUCING CRYSTALS

Bengt Kjellgren, Cleveland Heights, Ohio, assignor to The Brush Development Company, Cleveland, Ohio, a corporation of Ohio Original No. 1,906,758, dated May 2, 1933, Serial No. 358,629, April 27, 1929. Application for reissue May 1, 1935, Serial No. 19,270

12 Claims. (Cl. 23—1)

This invention relates to crystals and the method of producing the same, particularly to crystals of clear, uniform structure suitable for use in the manufacture of piezo-electric apparatus.

The chief objects of the invention are comprehended in the provision of methods of producing crystals, including crystals of Rochelle salt and the like, by which crystals of desired sizes and proportions and having clear, solid, and homogeneous structures can readily be produced.

A further object is to provide a method by which it is possible readily to produce any desired number of crystals uniform as to size, proportions and homogeneity of structure, thus facilitating the commercial production of piezo-electric devices from such crystalline material.

Other objects, more or less incidental or ancillary to the foregoing, as well as the manner in which all of the objects are attained, will be pointed out in the following description with reference to the accompanying drawing.

Crystals are used among other things in the purification of chemicals and to a very great extent in the making of piezo-electric apparatus. It is very desirable in these arts that the crystals be large, uniform, and clear, and that they be practically free of the mother liquor which is quite frequently contained within the same. Furthermore, it is very desirable for most purposes that the crystal structure be substantially free of the seed from which it is produced.

Heretofore, seed crystals have usually been produced by increasing the saturation of the crystal salt solution, as by gradually reducing the temperature of the salt solution until a plurality of small crystals of various shapes and sizes are formed and deposited on the bottom of the vessel containing the salt solution. The most perfect of these small crystals are selected, washed and dried and are used as seeds for growing larger crystals. The number of perfect usable seeds is, however, usually a very small portion of the total number of seeds deposited. The selected seed crystals are either placed on the bottom of a vessel containing a crystal salt solution, or are suspended in the solution by a string or small wire, and the saturation of the solution is then increased by lowering the temperature of the same, by introducing more salt into the solution or by any other suitable method. As soon as the solution tends to become supersaturated the seed crystals begin to increase in size and large crystals are gradually formed. The crystal seed in crystals formed in this manner remains embedded in the crystal structure plainly discernible in the center or bottom face of the same.

Crystals grown by this prior method are non-homogeneous in structure due to the inclusion of the seed in the bottom surface or central portion thereof, and tend to grow to proportions which cannot be controlled, since they are peculiar to the habits of the salt being crystallized.

The present invention proposes an improved method wherein superior crystals having predetermined proportions not necessarily characteristic of the salt to be crystallized, may be readily produced from seeds cut to predetermined shape from a crystalline mass of the salt to be crystallized or from a salt of similar crystalline habits.

In the drawing, crystals of Rochelle salt are shown for the purpose of illustration and explanation, but it is to be understood that the method of producing the same, which is about to be described, is also applicable for producing crystals of other salts.

In the drawing, Figure 1 is a fragmentary perspective view of a Rochelle salt crystal showing in broken outline a plurality of seeds to be cut therefrom.

Figure 1:
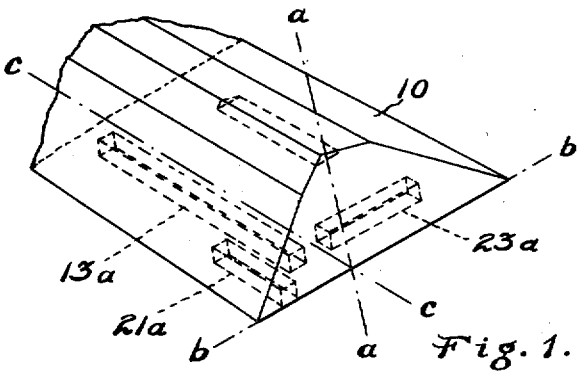

Referring to the accompanying drawing in which like numerals refer to like parts throughout the several views, and particularly to Fig. 1, a fragmentary portion of a Rochelle salt crystal 10 is shown as having a minor or electrical axis *a—a*, a major transverse axis *b—b* and a major longitudinal axis *c—c*.

Figure 5:
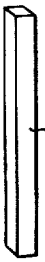
Figure 6:
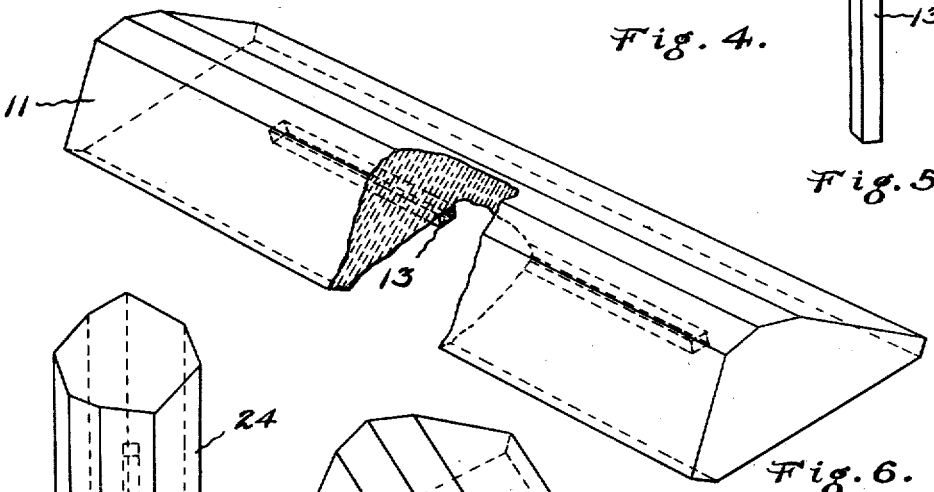
Fig. 6 is a perspective view of a crystal produced from the seed shown in Fig. 5, a portion of the crystal being broken away to show the seed.

For the purpose of explanation it will be assumed that it is desired to produce the half crystal 11 shown in Fig. 6. The crystalline axes just described are first determined, either by inspection or test, for the selected crystal 10 from which the seed is to be taken, and the rectangular seed 13 as shown in Fig. 5, or longer, is cut from the crystal 10 parallel to the major longitudinal axis *c—c* as indicated by the broken outline 13[a] of the seed in Fig. 1. The most convenient method of cutting the seed from the crystal 10 is to use a modified band saw, although it is to be understood that other practical cutting devices may be used.

Commercially, a crystal having as much available clear homogeneous material as possible is desired and this type of crystal is best obtained by growing a half crystal such as the crystal 11 which has been taken as an example.

The seed 13 after it has been cut to the desired shape is ready to be used for producing the crystal 11 and is preferably placed in a depression 14 formed in the bottom 15 of the vessel 16. It is preferable that the bottom 15 be formed of a cushioning material, such as rubber or other shock absorbing substance, so that the formation of extraneous crystalline centers due to mechanical shocks or vibrations, is materially reduced.

Figure 10:
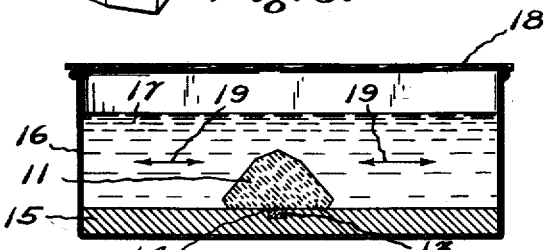
Fig. 10 is a section through one form of apparatus used in producing crystals showing a partly formed crystal in cross section.

As just pointed out, the seed 13 cut from the crystal 11 is preferably planted in a depression so that the salt solution will crystallize on the exposed surface of the seed. It is obvious that it may be planted to rest entirely in the depression or partly in the depression, and that the salt solution will crystallize on the exposed surface of the seed regardless of whether the seed projects above the surface of the bottom of the vessel, is flush with the surface or is even positioned below the surface. The preferable method of planting the seed, however, is to form the depression 14 to such a depth that when the seed is positioned therein the upper face of the seed will lie substantially flush with the surface of the bottom 15 as illustrated in Fig. 10, so that when the salt solution is crystallized on the exposed surface of the seed 13, the seed will not be included in the crystal structure, but will lie external to the surface thereof, as shown in Fig. 6, a portion of the crystal structure being broken away to show this feature.

However satisfactory results have been obtained by planting the seed with its upper face positioned below the surface of the bottom of the vessel containing the salt solution. This method causes a crystal to be grown similar to the one shown in Fig. 7, wherein the seed is separated from the adjacent crystal face by a thin growth 30 of crystalline material.

Satisfactory results have also been obtained by planting the seed in the depression in such a manner that a portion of the same projects above the surface of the bottom of the vessel. The salt solution crystallizes about the exposed surface of the seed and produces a crystal similar to the one shown in Fig. 9 wherein a small portion of the seed is incorporated in the body thereof at the plane of crystalline growth.

A filtered Rochelle salt solution 17 made alkaline corresponding to about 0.1 normal sodium or potassium hydroxide solution and containing enough Rochelle salt to become slightly supersaturated at about 36 degrees C. is heated to about 50 or 55 degrees C. and then poured into the vessel 16. It is desirable to pour the solution into the vessel at a temperature above the saturation temperature to prevent the formation of accidental crystals. When the temperature of the solution has dropped to about 41 degrees C., the seeds are planted in the desired manner as previously described, and the top 18 is placed over the vessel 16. The temperature of the solution is then allowed to drop approximately to the saturation point. This temperature is maintained until the conditions in the solution are in equilibrium, that is, until the seeds have stopped growing or dissolving, depending on the specific temperature of the solution. When an equilibrium of the solution is reached, a slow reduction of the temperature of the same is begun and the crystal 11 starts to grow about the exposed surfaces of the seed 13. It is very desirable that a circulatory or to-and-fro motion be imparted to the solution during the formation of the crystal 11 as indicated by the arrows 19. The sides of the depression 14, in the bottom 15 of the vessel 16 exert sufficient friction against the sides of the seed crystal 13 to hold the same in position during the movement of the solution. As the crystal 11 gradually increases in size the temperature of the solution may be gradually lowered until the crystal reaches a suitable size. It may be desirable in some cases to use an evaporation process or even a combination of heat and evaporation. This, however, is optional.

Figure 9:
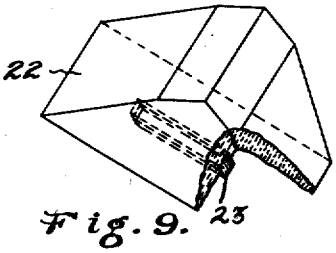
Fig. 9 is a perspective view of a crystal produced from the seed shown in Fig. 2, a portion of the crystal being broken away to show the seed.

As the crystal 11 grows on the exposed surface of the seed 13 its crystalline axes are determined by and correspond to the axes of the seed 13. When the crystal 11 has reached a sufficient size it is removed from the solution with the seed 13 adhering thereto. The entire seed 13, as shown in Fig. 6, lies outside of the surface of the crystal 11, and can be easily removed in any suitable manner, leaving no trace of the seed 13 in the body of the crystal structure. If, however, the crystal has been grown from a seed which was planted with a portion extending above the bottom of the vessel, a small portion extends into the crystal structure adjacent the plane of crystalline growth, as shown in Fig. 9. The bottom face of the crystal in this case can be cut off to remove the slight trace of the seed. The crystal may then be cut into homogeneous slabs to be used for the purpose for which they are intended.

Figure 2:
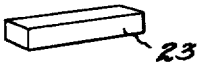
Fig. 2 is a perspective view of the short seed shown in broken outline in Fig. 1 cut parallel to the major transverse axis.
Figure 3:
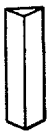
Fig. 3 is a perspective view of the triangular seed shown in broken outline in Fig. 1 cut parallel to the major longitudinal axis.
Figure 4:
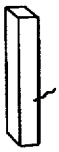
Figs. 4 and 5 are perspective views of the two long rectangular seeds shown in broken outline in Fig. 1 cut parallel to the major longitudinal axis.
Figure 8:
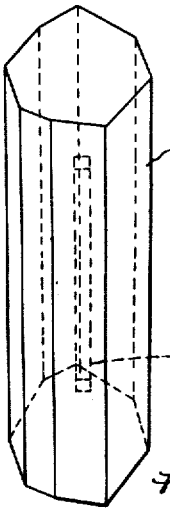
Fig. 8 is a perspective view of a crystal produced from a seed which is planted in an upright position.
Figure 7:
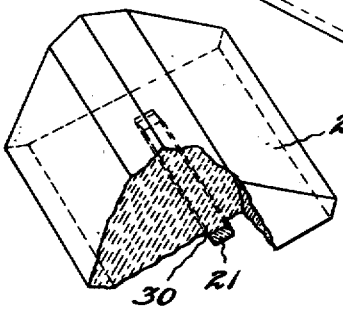
Fig. 7 is a perspective view of a crystal produced from the seed shown in Fig. 4, a portion of the crystal being broken away to show the seed.

The ratio of cross section to length in the produced crystal may be controlled by the relative length and cross section and orientation of the seed crystal. The seed 13 is shown as being relatively long and narrow and consequently the crystal 11 produced from the seed is also long and narrow. If the short crystal 20 shown in Fig. 7 is desired, the short seed crystal 21 shown in Fig. 4 is cut parallel to the longitudinal axis *c—c* of the crystal 10 as indicated by the broken outline 21[a] in Fig. 1. If the crystal 22 shown in Fig. 9, which is shorter in length than width, is desired a seed 23 shown in Fig. 2 is cut on the broken lines 23[a] of the crystal 10 parallel to the transverse axis *b—b*. If the full crystal 24 shown in Fig. 8 is desired the seed crystal 13 is planted on one of its ends in an upright position, and may be held in place by insertion into a hole formed in the bottom of the vessel, or suspended in the solution by a string.

Although it is preferable to plant the seeds in depressions in the bottom of the vessel containing the salt solution, as previously described, the advantageous characteristics of the previously described cut seeds may be utilized without planting the seeds in depressions, by planting the seeds directly on the flat bottom of the vessel containing the solution to be crystallized. Very satisfactory results have been obtained by planting cut seeds in this manner.

In commercial practice it is usually desirable to produce crystals of a single shape most suitable for the purpose for which they are intended. In this case a plurality of slabs are cut from a clear crystal or a portion thereof and the slabs are cut into equal parallel bars of suitable length and size for seeds. All crystals produced from these parallel bars or seeds will have the same general characteristics. That is, they will have substantially the same shape or length-width ratio, and under similar growing conditions, the same size and weight.

It is apparent that large, homogeneous crystals free from flaws or contaminations can be produced by the method just described. By using the method herein described, large clear crystals homogeneous in structure have been produced in three weeks time from seeds having predetermined proportions, which crystals varied in weight according to growing conditions, from three-quarters to five pounds. It is thus possible to produce a maximum of perfect usable slabs with minimum waste in cutting, from a single crystal because of the uniform and controlled shape and homogeneity, and also to produce a maximum of uniform crystals in a minimum time.

By the method of the present invention crystals having ratios of length to breadth varying from .5 to 6 have been produced. It is readily seen that the proportions of a crystal can be controlled by the proportions of the seed, and that large seeds of homogeneous structure can be produced as easily as short seeds, and with considerable more efficiency and rapidity than by the heretofore used method of growing seeds.

It is further apparent that satisfactory perfect crystals can be readily produced by the present invention which are suitable for use in the arts of making piezo-electric apparatus, optical apparatus, and the like.

This method may also be used to advantage in the purification of chemicals by the efficient production of large crystals free from the mother liquor or other contaminations.

With respect to my method as herein set forth, there are certain aspects relating to the control of the shape and orientation of the crystals produced which are not claimed herein as they constitute the subject matter of some of the claims of my application Serial No. 19,269, filed May 1, 1935, for the reissue of original Letters Patent No. 1,906,757.

It is to be understood that the shapes of crystals and the particular methods and operations set forth are for explanation and illustration only and that formal changes can be made in the invention without departing from the spirit and substance of the broad invention, the scope of which is commensurate with the appended claims.

What I claim is:

1. The method of producing crystals which consists in cutting a seed crystal from a crystalline mass in predetermined relationship to the crystalline axes of said mass, planting said seed in a depression in the bottom of a vessel containing a solution of the salt to be crystallized so that the salt solution will crystallize on the exposed surface of the seed, and causing said solution to crystallize on said seed.

2. The method of producing a crystal which consists in planting a seed in a depression in the bottom of a vessel containing a solution of the salt to be crystallized, and causing said solution to crystallize on the exposed surface of said seed.

3. The method of producing crystals which consists in planting a seed in a solution of the salt to be crystallized, protecting the bottom and portions of the sides of the seed from the solution, and causing the solution to crystallize on the unprotected portion of the seed.

4. The method of producing crystals which consists in cutting a seed crystal from a crystalline mass in predetermined relationship to the crystalline axes of said mass, planting said seed in a vessel containing a solution of the salt to be crystallized, with the greater portion of said seed encased by the bottom of said vessel, and causing said solution to crystallize on the exposed surface of said seed.

5. The method of producing crystals which consists in cutting a seed crystal from a crystalline mass in predetermined relationship to the crystalline axes of said mass, planting said seed in a depression formed in the bottom of the vessel containing a solution of the salt to be crystallized with the greater portion of the surface of said seed concealed by said depression, and causing said solution to crystallize about the exposed surface of said seed, whereby said seed will lie outside the plane of crystalline growth of the produced crystal.

6. The method of producing crystals which consists in cutting a seed crystal from a crystalline mass in predetermined relationship to the crystalline axes of said mass, planting said seed in a solution of the salt to be crystallized with the greater portion of said seed positioned below the plane of the crystal to be produced, and causing said solution to crystallize about the exposed surface of said seed.

7. The method of producing crystals which consists in concealing the greater portion of a seed crystal in a cushioning material, and causing a solution of the salt to be crystallized to crystallize on the exposed portion of said seed, whereby the greater portion of said seed crystal will lie externally of the produced crystal.

8. The method of producing crystals which consists in cutting a seed crystal from a crystalline mass in predetermined relationship to the crystalline axes of said mass, concealing the greater portion of said seed crystal in a cushioning material carried by a vessel containing a solution of the salt to be crystallized, and causing said solution to crystallize about the exposed surface of said seed crystal to form a crystal with the greater portion of said seed positioned externally thereof.

9. The method of producing large crystals of the Rochelle salt type which consists in cutting a seed crystal from a crystalline mass in predetermined relationship to the crystalline axes thereof, planting said seed in a salt solution, protecting the greater part of the surface of said seed from said solution, and causing said solution to crystallize about the exposed surface of said seed so that the said seed will lie outside the produced crystal.

10. The method of producing a large homogeneous crystal of the Rochelle salt type having a weight in excess of three-quarters of a pound, which consists in cutting a seed crystal from a crystalline mass in predetermined relationship to the crystalline axes thereof, planting said seed in a depression in the bottom of a vessel containing a solution of the salt to be crystallized with the greater portion of the surface of said seed concealed by the walls of said depression, and causing said solution to crystallize about the exposed surface of said seed whereby said seed will lie externally of the produced crystal.

11. The method of producing a crystal which consists in planting a seed in a recess in an inner wall of a vessel containing a solution of the salt to be crystallized, and causing said solution to crystallize on the exposed surface of said seed.

12. The method of producing crystals which consists in planting a crystalline seed in a solution of the salt to be crystallized, protecting the greater portion of the surface of said seed from said solution, and causing said solution to crystallize about the exposed surface of said seed so that the said seed will lie outside the produced crystal.

BENGT KJELLGREN.